United States Patent [19]

Wadham

[11] 3,964,092
[45] June 15, 1976

[54] SEMICONDUCTOR DEVICES WITH CONDUCTIVE LAYER STRUCTURE

[75] Inventor: Eric Wadham, Winchester, England
[73] Assignee: U.S. Philips Corporation, New York, N.Y.
[22] Filed: Nov. 11, 1974
[21] Appl. No.: 522,583

[30] Foreign Application Priority Data
Nov. 23, 1973  United Kingdom............... 54392/73

[52] U.S. Cl.................................. 357/68; 357/71
[51] Int. Cl.² ........................................ H01L 19/00
[58] Field of Search................................ 357/68, 71

[56] References Cited
UNITED STATES PATENTS

| | | | |
|---|---|---|---|
| 3,365,707 | 1/1968 | Mayhew............................. | 357/68 |
| 3,659,162 | 4/1972 | Toshio et al........................ | 357/68 |
| 3,823,348 | 7/1974 | Agusta et al....................... | 357/68 |

*Primary Examiner*—Alfred E. Smith
*Assistant Examiner*—E. R. La Roche
*Attorney, Agent, or Firm*—Frank R. Trifari; Leon Nigohosian

[57] ABSTRACT

A semiconductor device, for example an integrated circuit comprising insulate gate field effect transistors in which the gate electrodes comprise doped portions of a deposted layer of polycrystalline silicon, wherein a first conductive connection layer extends at least partly on insulating material present on one surface of a semiconductor body, said first layer being insulated from and crossing over an underlying, second conductive connection layer which is of semiconductor material locally deposited on said one surface of the semiconductor body, said second layer and the underlying portion of the semiconductor body comprising a quantity of doping substance introduced via said second layer, for example in the case of a silicon gate circuit introduced at the same time as simultaneously doping the gate electrodes and forming the source and drain regions. The form of undercrossing comprising the second conductive connection layer and the underlying doped portion of the semiconductor body can be provided in a simple manner having a very low series resistance compared with prior art forms of undercrossing.

12 Claims, 11 Drawing Figures

SEMICONDUCTOR DEVICES WITH CONDUCTIVE LAYER STRUCTURE

This invention relates to semiconductor devices, particularly but not exclusively, semiconductor integrated circuits, comprising a semiconductor body having at least two connections crossing each other, namely a first electric connection in the form of a conductive layer extending over an insulating layer present on a surface of the body, and a second electric connection present at least partly below the first connection, crossing said connection and being insulated herefrom by an intermediate insulating layer.

Examples of such devices are semiconductor integrated circuits in which the first and second conductive connection layers form interconnection layers between circuit elements. In a first type of known integrated circuits the first and second conductive connection layers are formed by metal layers at different levels and seperated from each other by, for example, deposited insulating material. In these two-level metallisation integrated circuits a crossing between a metal connection layer at an upper level and a metal connection layer at a lower level may be suitably provided. However, a two-level metallisation pattern is not always desired because it can lead to high cost in manufacture and lower yields. A crossing connection is achieved in other known integrated circuits in different ways, For example, the underlying, second conductive connection layer may be provided as a surface region diffused in the body and insulated from the first conductive connection layer, which generally is of aluminium, by an insulating layer. Such a diffused surface region is sometimes referred to as an "underpass" where it forms a conductive connection between two further conductive connection layers, for example aluminium strips situated at least partly on an insulating layer on the semiconductor body surface. Generally such a diffused conductive connection layer is satisfactory. However in some integrated circuits it may be necessary to provide an underpass with a very low series resistance. This is not always readily achieved, particularly when it is desired to effect the diffusion treatment for making the underpass layer simultaneously with the diffusion which should be carried out in another part of the semiconductor body to form a region of a circuit element, as the impurity concentration desired for obtaining suitable parameters in the circuit element often is not sufficiently high to provide a connection layer of low series resistance.

In a further type of known circuits which comprise a plurality of insulated gate field effect transistors, a layer of doped polycrystalline silicon is used in the form of a plurality of discrete portions, said discrete portions forming gate electrodes of transistors and further extending on an insulating layer on the semiconductor body surface as conductive connection layers between various circuit elements. In such a so-called "silicon-gate" circuit the doped polycrystalline silicon layer portions may be employed as a first lower level of interconnection, while a second level of interconnection may be formed by portions of an aluminium layer which are insulated from the polycrystalline silicon layer by a deposited insulating layer. A doped polycrystalline silicon layer extending on an insulating layer on the semiconductor body surface may be employed as the said second conductive layer which is crossed by and insulated from an overlying first conductive connection layer of aluminium. Where it is desired to effect a connection via a doped polycrystalline silicon layer with a low series resistance similar problems arise, since the doping level of the polycrystalline silicon as obtained upon doping during a normal process step of such an integrated circuit often is not high enough.

In general in the so-called "silicon-gate" circuits the series resistance of a conductive connection layer formed by a diffused surface region obtained simultaneously with the source and drain diffusion is less than that of a similarly dimensioned conductive connection layer consisting of polycrystalline silicon extending on an insulating layer on the semiconductor body surface and also doped simultaneously with said source and drain diffusion. Even the series resistance of such a diffused surface layer often is not sufficiently low for some interconnections which have to be crossed by one or more metal interconnection layers.

According to the invention a semiconductor device of the kind described in the preamble is characterized in that the second electric connection comprises a conductive layer having a first component layer in the form of semiconductor material which is locally deposited on the surface of the body and which is doped with an impurity, and having a second component layer which is formed by a surface region of the body which is present below the first component layer and which is also doped with the said impurity introduced into the body via the first component layer.

As experiments have demonstrated, in this device a surprisingly low series resistance interconnection may be obtained via the second conductive connection layer.

A possible explanation for this is that, upon doping the first component layer which consists preferably and at least for the greater part of polycrystalline material, the impurity diffuses through said polycrystalline layer in a comparatively high concentration in the underlying semiconductor body. As a result of this, in spite of the presence of the polycrystalline material below said layer, a low-ohmic surface layer of the same conductivity type as the polycrystalline layer can be formed in the semiconductor body and forms the second component layer. Due to the presence of the polycrystalline component layer, the concentration in the second component layer will not, or at least hardly, decrease as a result of the provision of a passivating oxide layer on the body. This is with the case in which such an oxide layer is provided directly on the surface of the body, (i.e., above the surface zone where the second component layer is formed according to the invention), in the absence of the polycrystalline layer, in which case a part of the impurity can disappear into the oxide layer, for example, by out-diffusion. The doping concentration and hence the conductivity of the second component layer can thus maintain a comparatively very high value. The particular advantages of this form of crossing connection are manifest in certain forms of integrated circuits as will be described hereinafter.

In a preferred form of a semiconductor device in accordance with the invention the first component layer of the second conductive layer is of deposited polycrystalline semiconductor material.

The second conductive connection layer may be doped in various ways, for example by ion implantation. However, a preferred embodiment is characterized in that the impurity is provided in the second conductive layer by means of vapour phase diffusion. Another suitable method within the scope of the invention is the deposition of an already doped polycrystalline semiconductor layer followed by a heating step to diffuse the impurity in the deposited layer into the underlying semiconductor body portion.

The second conductive layer may be in the form of a strip which is crossed by the first conductive connection layer, said strip providing at least part of a conductive connection between two further conductive connection layers which extend at least partly on the insulating layer on the semiconductor body surface. In such a device at least the surface portion of the semiconductor body adjacent one end of the strip may be more highly doped, the further conductive connection layer associated with said one end of the strip being applied directly on said more highly doped surface portion.

A preferred embodiment of a device according to the invention is characterized in that at least one end of the strip the further conductive connection layer associated wwith said one end of the strip is applied directly on a portion of the strip which lies directly on the semiconductor body surface.

In another form in which the second conductive layer is in the form of a strip which is crossed by the first conductive layer, the strip may provide the conductive connection between a surface region of the semiconductor body, said surface region belonging to a circuit element, and another such surface region or a further conductive connection layer which extends at least partly on the insulating layer on the semiconductor body surface.

The surface portion of the semiconductor body adjacent at least part of the periphery of the second conductive layer may also have a doping concentration and be doped, for example, with the same impurity element as the second conductive layer.

A device in accordance with the invention may be a semiconductor integrated circuit wherein the first and second conductive layers form interconnection layers at different levels. In a preferred form of such an integrated circuit the semiconductor body is of silicon and the second conductive layer is of doped polycrystalline silicon. The first conductive layer may be of aluminium.

The integrated circuit may comprise a plurality of insulted gate field effect transistors, the first component layer of the second conductive layer being one of a plurality of discrete portions of a deposited layer of polycrystalline silicon, at least another part of said discrete portions of the polycrystalline silicon layer being situated at least partly on the insulating layer on the semiconductor body surface and forming a gate electrode of an insulated gate field effect transistor.

In one preferred form of such a so-called "silicon-gate" circuit said other discrete portion of the polycrystalline silicon layer extends as the gate electrode on a relatively thin part of the insulating layer on the semiconductor body surface and further extends as an interconnection layer on a relatively thick part of the insulating layer on the semiconductor body surface. This form of circuit may be such that at a position remote from the gate electrode said other discrete portion of the polycrystalline silicon layer extends in contact with a surface region of the semiconductor body.

Other features of a semiconductor device in accordance with the invention will be apparent from the following description of various embodiments, given by way of example, with reference to the accompanying diagrammatic drawings, in which.

Figure 1:
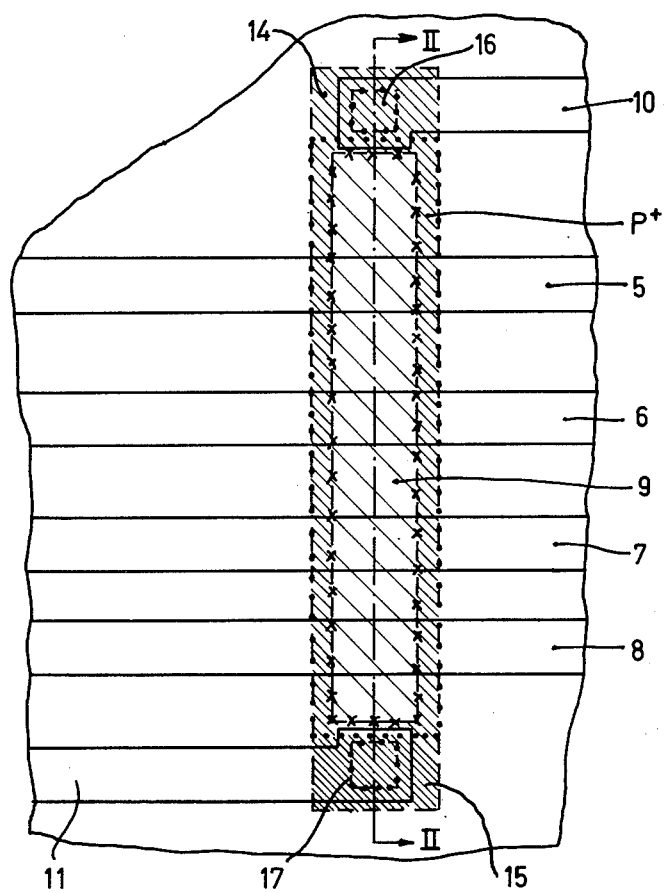
FIG. 1 is a plan view of part of the semiconductor body of a semiconductor device in accordance with the invention.
Figure 6:
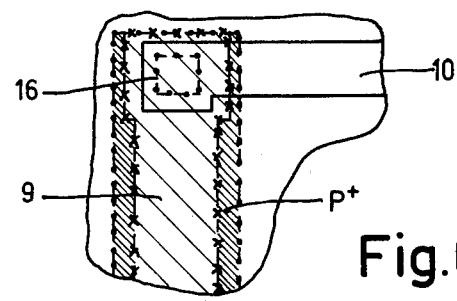
Figure 2:
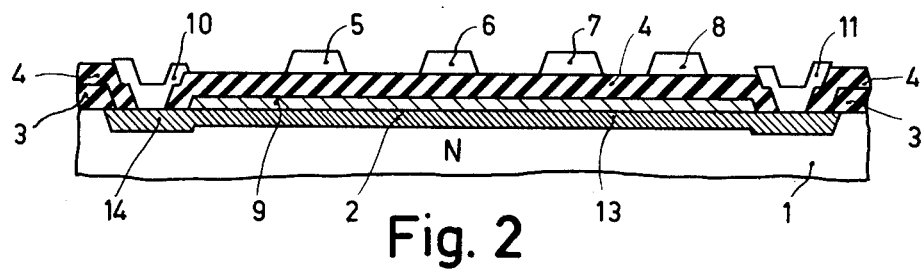
FIG. 2 is a cross-sectional view taken on the line II—II in FIG. 1.
Figure 3:
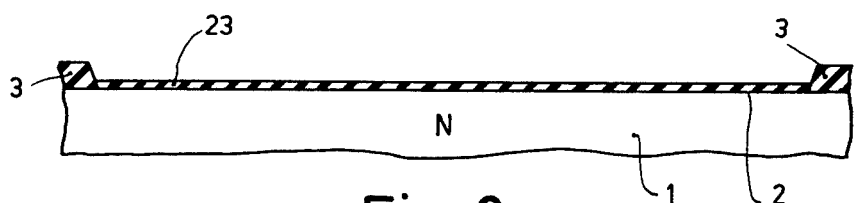
Figure 4:
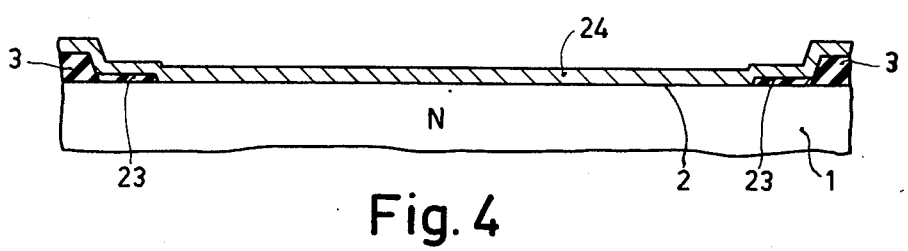
Figure 5:
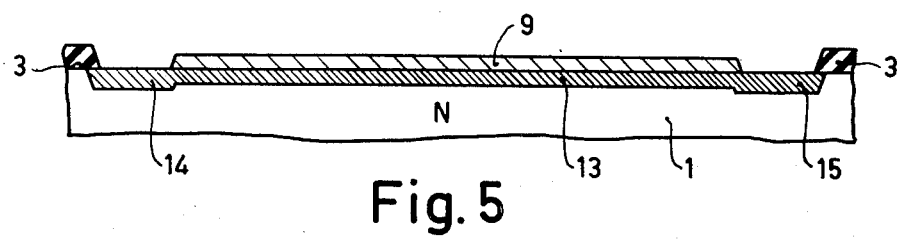
Figure 7:
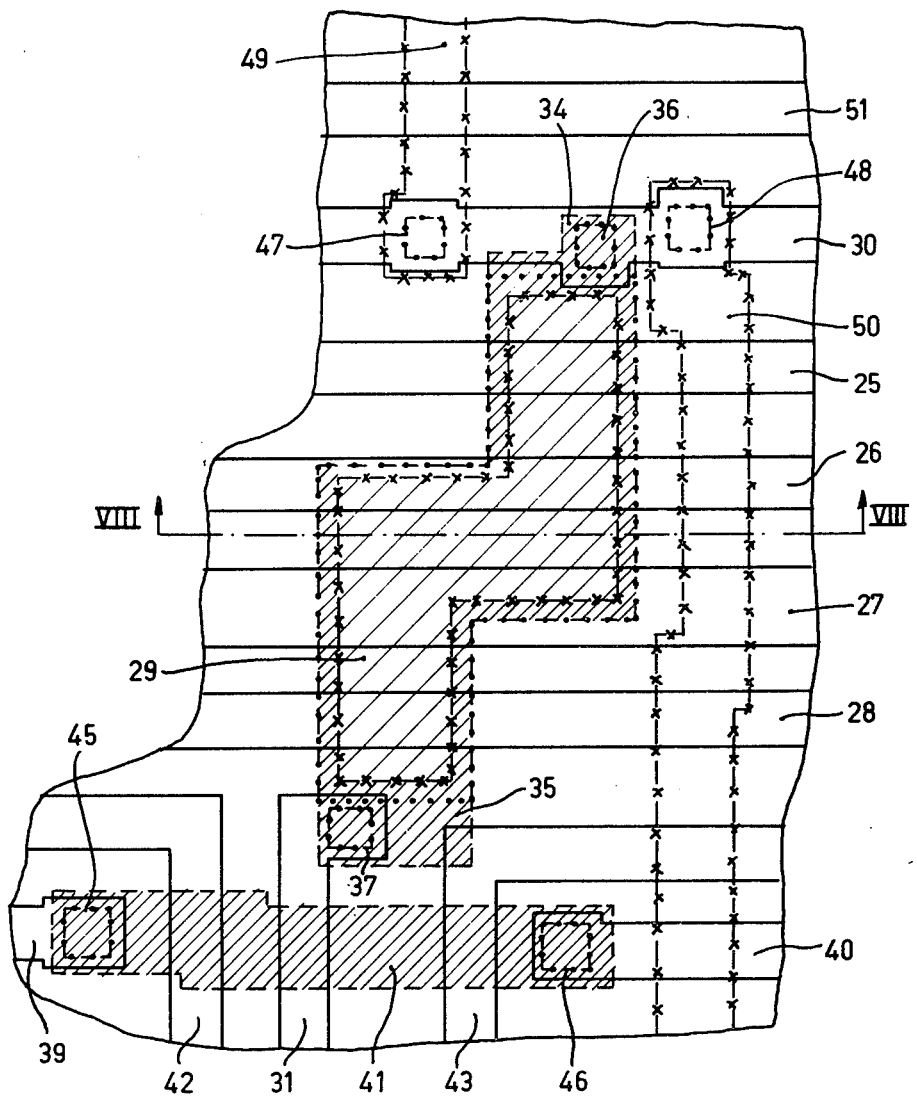
Figure 8:
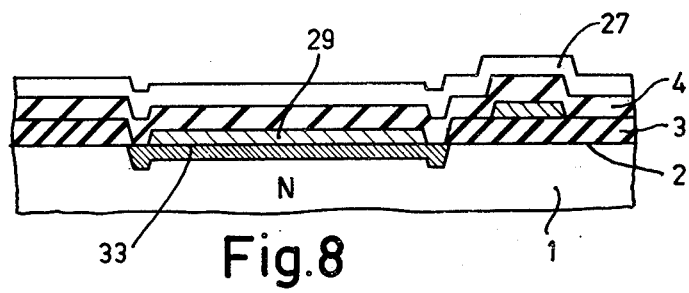
Figure 9:
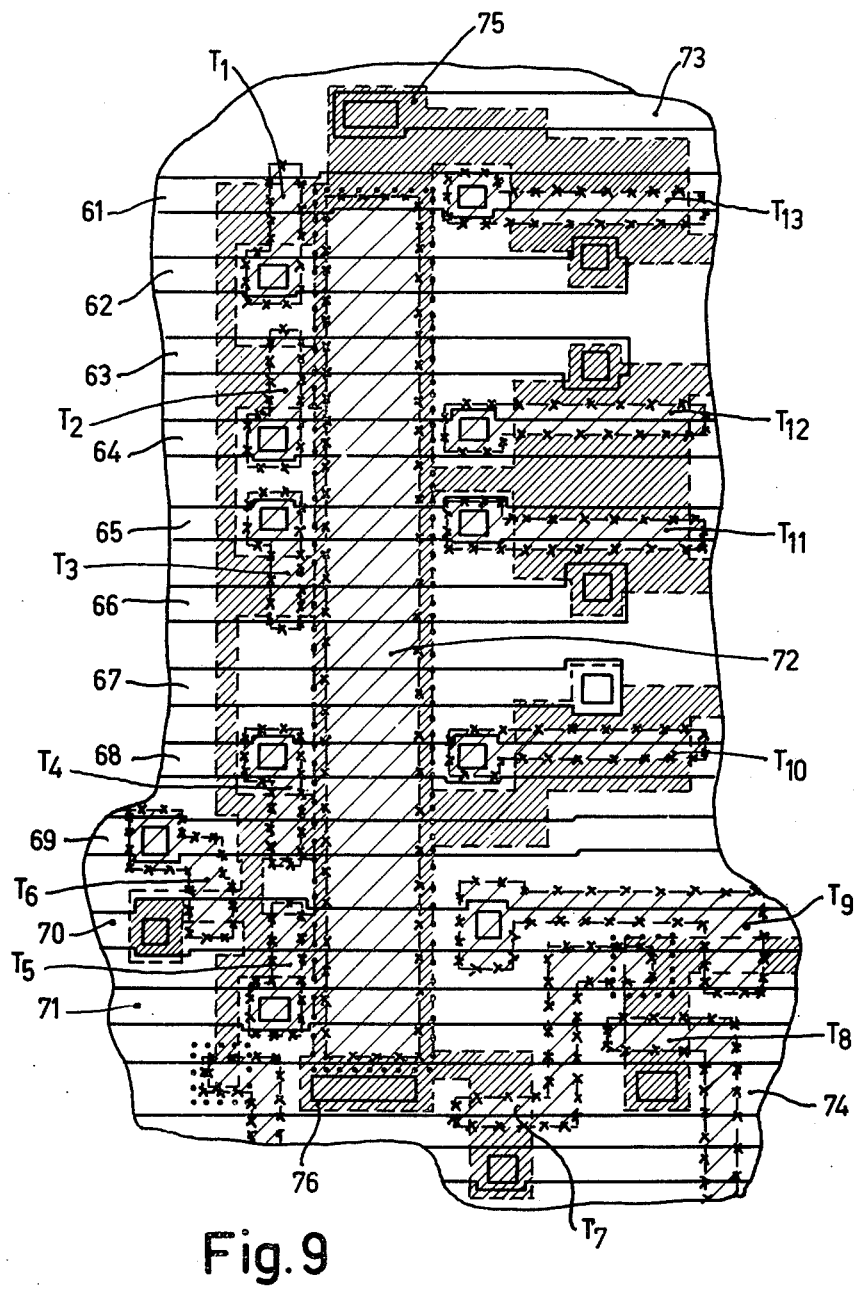

FIGS. 3 to 5 inclusive show corresponding cross-sectional views of the integrated circuit device shown in FIGS. 1 and 2 during various stages in the manufacture thereof;

FIG. 6 is a plan view of part of an integrated circuit device which is a modification of the embodiment shown in FIGS. 1 and 2;

FIG. 7 is a plan view of part of a further circuit device in accordance with the invention;

FIG. 8 is a cross-sectional view taken on the line VIII—VIII in FIG. 7;

FIG. 9 is a plan view of part of a further integrated circuit device in accordance with the invention.

Figure 10:
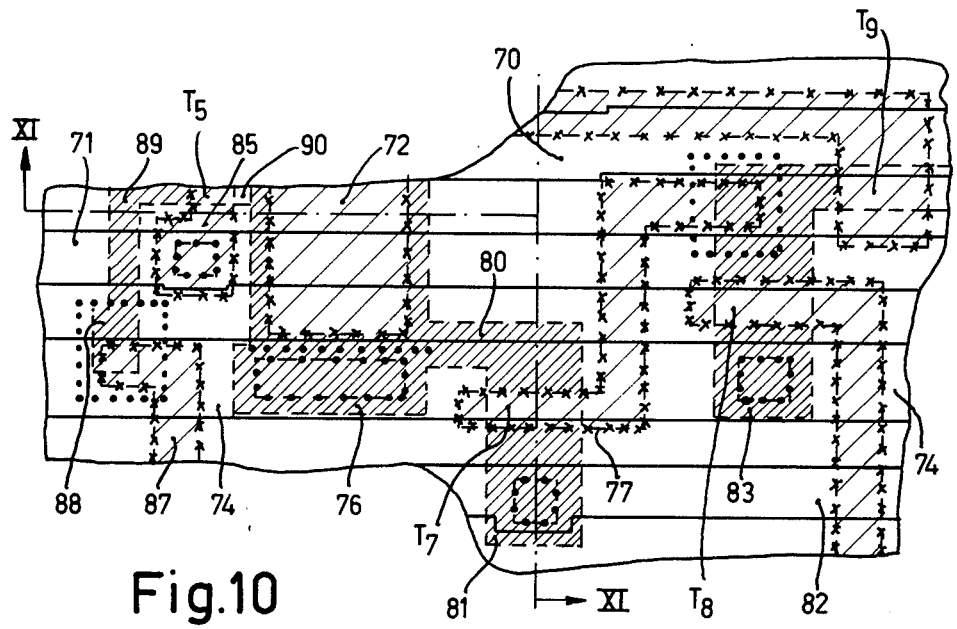

FIG. 10 is an enlarged plan view of part of the device shown in FIG. 8, and

Figure 11:
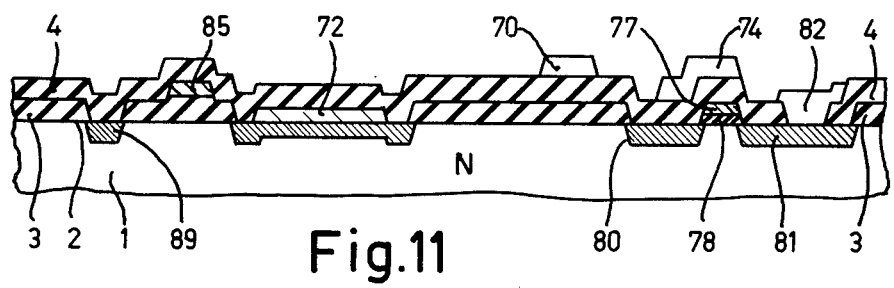

FIG. 11 is a cross-sectional view taken on the line XI—XI in FIG. 10.

Referring now to FIGS. 1 and 2, the semiconductor device of which a part is shown consists of an integrated circuit comprising a plurality of insulated gate field effect transistors each having a gate electrode formed by a portion of a layer of deposited polycrystalline silicon. For the sake of clarity of illustration the transistors are not shown in FIGS. 1 and 2. The integrated circuit comprises an n-type silicon substrate 1 (FIG. 2) of for example 5 - 10 ohm.cm. resistivity and 250–400 microns thickness. On a part of the surface 2 of the substrate there is a thermally grown silicon oxide layer 3 of 1 micron thickness. Parts of the layer 3 are covered with a deposited silicon oxide layer 4 or approximately 1.4 microns thickness. Four conductive connection layers 5, 6, 7 and 8 referred to as first conductive connection layers, in the form of aluminium layer strips each of approximately 10 microns width and 1.5 microns thickness extend on the deposited oxide layer 4. These cross-over and are insulated from a second conductive connection 9 (FIG. 1), referred to as a second conductive layer. The second conductive layer 9 is in the form of a strip and provides part of the conductive connection between two further conductive layers consisting of aluminium layer strips 10 and 11. The strips 10 and 11 are situated mainly on the silicon oxide layer 4 at opposite sides of the aluminium layer strips 5, 6, 7 and 8 and extend in contact with surface portions of the silicon body.

The second conductive connection layer 9, 13 consists of a first component layer 9 of polycrystalline silicon locally deposited on the silicon body surface in an aperture in the thermally grown silicon oxide layer 3. The layer 9 contains a diffused concentration of boron and the surface region 13 of the silicon body underlying the layer 9 if also p-type also containing a concentration of boron diffused therein via the layer 9. The p-type layer 13 forms the second component layer of the connection 9, 13.

The surface portion of the silicon body around the whole perimeter of the strip 9 is also doped with boron, due to the direct diffusion of boron into portions of the surface initially exposed by local removal of the silicon oxide layer 3. At opposite ends of the strip 9, 13 there are thus present $p^+$-diffused regions 14 and 15. The regions 14 and 15 have a depth of 1.5 microns and a surface concentration of approximately $10^{20}$ atoms cm.$^{-3}$ said regions correspond in depth and doping to the source and drain regions of the insulated gate field effect transistor elsewhere in the integrated circuit. At apertures 16 and 17 in the deposited silicon oxide layer 4 the aluminium layer strips 10 and 11 form contact with the p$^+$-regions 14 and 15.

In the plan view of FIG. 1 and in all the plan views to be described hereinafter broken lines are used to indicate the boundary of an aperture formed in the silicon oxide layer 3 in an early stage of the manufacturing process employed in the production of the device. Lines having alternately a dash and a cross are used to indicate the boundary of portions of acceptor doped polycrystalline silicon, said doping having been effected by diffusion simultaneously with the acceptor diffusion into exposed portions of the silicon body surface within the apertures in the silicon oxide layer 3. Lines having alternately a dot and a dash indicate contact apertures in the oxide layer 4. Lines in the form of a series of dots represent the boundaries of areas over which removal has been effected of a thermally grown relatively thin silicon oxide layer formed in the apertures in the relatively thicker silicon oxide layer 3 immediately following the provision of the apertures in the thick oxide layer 3, said removal of the relatively thin oxide having been effected prior to the deposition of the polycrystalline silicon.

In the plan view Figures the presence of diffused boron in a polycrystalline silicon layer is indicated by diagonal lines of relatively wide spacing and the presence of diffused boron in portions of the silicon body is indicated by diagonal lines of relatively narrow spacing.

In the device shown in FIGS. 1 and 2 the strip 9 of doped polycrystalline silicon has cross-dimensions of approximately 20 microns × 130 microns. The sheet resistance of the undercrossing between the aluminium strips 10 and 11 and formed by the doped polycrystalline silicon layer 9 and the underlying p-type silicon region 13 is approximately 20 ohms per square. This is considerably lower than an estimated value of 50 ohms per square in the case where such an undercrossing is made as a p-type diffused surface region and an estimated value of 150 ohms per square where such an undercrossing is made by a layer of doped polycrystalline silicon situated on the silicon oxide layer 3.

Some initial stages in the manufacture of the integrated circuit device shown in FIGS. 1 and 2 will now be described with reference to FIGS. 3 to 5 inclusive.

The starting semiconductor body is an n-type silicon wafer 1 for example of 3 inches diameter, of 5 – 10 ohm.cm. resistivity and 250 – 400 microns thickness. As is conventional practice in the art a large plurality of integrated circuit devices are simultaneously processed in the single wafer. For the sake of simplicity of description reference will only be made to the manufacturing steps so far as they relate to a single integrated circuit device.

The orientation of the major surface 2 of the silicon wafer is <111> and a silicon oxide layer 3 of 1 micron thickness is thermally grown by a conventional process. Following this apertures are formed in the layer 3 by a photolithographic and etching process. Thereafter on the silicon surface exposed by said aperture a further silicon oxide layer 23 of 1200 Å thickness is provided by thermal oxidation.

The next stage is a photolithographic masking and etching process to remove portions of the thin silicon oxide layer 23. This stage does not involve a critical mask alignment and the area over which the thin oxide is removed lies within the boundary indicated by the continuous line of dots in FIG. 1.

A polycrystalline silicon layer 24 of 0.5 micron thickness (FIG. 4) is then deposited over the whole surface of the wafer and thus extends locally in contact with the portions of the surface 2 exposed by the removal of the thin oxide layer 23. The polycrystalline silicon layer 24 further extends on the remaining portions of the thin oxide layer 23 and the relatively thicker oxide layer 3.

By a photolithographic and etching step the layer 24 of polycrystalline silicon is defined as a plurality of discrete portions, one of such portions being the strip 9. Other portions of the layer 24 where they extend on the thin oxide layer 23 may constitute the insulated gate electrodes of the field effect transistors. Further portions of the layer 24 where they extend on the thick oxide layer 3 may constitute interconnection paths, for example between the gate electrodes and surface regions of the body where the thin oxide layer 23 has been locally removed.

The next step in the processing is the removal by etching of the remaining portions of the thin oxide layer 23 where exposed following the local removal of the polycrystalline silicon. Said portions will lie within the originally formed apertures in the silicon oxide layer 3. During this etching the exposed portions of the thick silicon oxide layer 3 will be reduced in thickness only to a small extent.

A boron diffusion is then carried out to render the polycrystalline silicon layer portions more highly conductive and to form p$^+$-diffused surface regions at the exposed portions of the silicon body. Some of the thus provided p$^+$-surface regions may constitute source and drain regions of the transistors and other regions constitute contact regions, such as the regions 14 and 15 in FIGS. 1 and 2, for applying contacts to the conductive connection layers. Where the polycrystalline silicon is in direct contact with the silicon surface 2 the boron is diffused through the polycrystalline silicon and into the underlying surface portion of the silicon body so that at the same time low-ohmic p-type regions such as the region 13 (FIGS. 2 and 5) are formed below the polycrystalline layers. In other such positions this diffusion through the polycrystalline silicon completes a contact between a polycrystalline silicon layer portion and a diffused p$^+$-surface region such as a source or drain region of a transistor.

After the boron diffusion stage, a silicon oxide layer 4 of 1.5 microns thickness is deposited over the whole surface by a conventional process. A photomasking and etching stage then is carried out to form contact apertures in the oxide layer 4. In these positions the silicon surface is locally exposed for contacting surface regions in the body 1 and/or a polycrystalline silicon layer portion, where it should be contacted.

An aluminium layer of approximately 1.5 microns thickness is then deposited over the whole surface, including within the contact apertures in the insulating layers 3 and 4. Thereafter by a photomasking and etching step the aluminium layer is etched until a plurality of discrete interconnection portions. The further processing of the wafer may be as conventionally carried out in integrated circuit manufacture.

FIG. 6 shows in plan view part of a part of a circuit which is a modification of the circuit shown in FIGS. 1 and 2. The aluminium conductors 10 and 11 do not directly contact the surface of the body at opposite sides of the undercrossing. As shown in FIG. 6, the conductor 10 extends in an aperture 16 in the deposited oxide layer 4 in contact with an underlying portion of the doped polycrystalline silicon layer 9. Thus the difference between this embodiment and the preceding one in terms of its processing is that the polycrystalline silicon layer 9 is arranged to extend in contact with the silicon surface along the whole length of the aperture in the silicon oxide layer 3 by arranging the mask used for etching out the thin oxide layer 23 prior to the polycrystalline silicon deposition such that the thin oxide layer 23 is etched away along the whole length of the aperture in the thicker oxide layer 3. Also it will be apparent from FIG. 6 that the mask used for defining the polycrystalline silicon layer 9 is suitably adapted to provide an area of appropriate dimensions to receive thereon the subsequently applied aluminium connection layer 10 via the aperture 16 formed in the deposited oxide layer 4. It is found that this form of interconnection between the aluminium connection layers 10 and 11 and the undercrossing comprising the doped polycrystalline silicon layer 9 and the underlying p-type region 13 can be obtained substantially without any increase in series resistances and in many instances this detailed configuration may be preferred to the one shown in FIGS. 1 and 2 as considerable simplification in the masking required is obtained.

Referring now to FIGS. 7 and 8, there is shown another part of an integrated circuit which may comprise a plurality of insulated gate field effect transistors manufactured by a process as described with reference to the preceding embodiment. Again, for the sake of clarity of illustration, transistors are not shown in the plan view of FIG. 7, this Figure showing mainly only a device structure in accordance with the invention comprising a crossing connection.

The silicon semiconductor body and the insulating layers correspond to the body and the insulating layers of the embodiment shown in FIGS. 1 and 2 and are indicated by the same reference numerals. Four conductive connection layers 25, 26, 27 and 28, referred to as first conductive connection layers, in the form of aluminium layer strips extend on the surface of the deposited oxide layer 4. These conductive layers crossover and are insulated from a conductive connection layer 29, 33, referred to as a second conductive connection layer. The layer 29, 33 is in the form of a strip and provides the conductive connection between two further conductive connection layers consisting of aluminium layer strips 30 and 31 situated on the deposited silicon oxide layer 4 at opposite sides of the aluminium layer strips 25, 26, 27 and 28.

The second conductive connection layer 29, 33 consists of a layer 29 of polycrystalline silicon locally deposited on the silicon body surface in an aperture in the silicon oxide layer 3. The strip 29 is doped by means of diffusion with boron and the portion 33 (FIG. 8) of the silicon body underlying the strip 29 is p-type and is also doped with boron diffused therein via the strip 29.

A surface portion of the body around the whole perimeter of the strip 29 is doped with boron, due to the direct diffusion of boron into said surface part of the silicon surface initially exposed to local removal of the silicon oxide layer 3. At the opposite ends of the strip there are present $p^+$-diffused regions 34 and 35, said regions being similar to the regions 14 and 15 in FIG. 1 and again corresponding in depth and doping to the source and drain regions of transistors present elsewhere in the integrated circuit. At apertures 36 and 37 in the silicon oxide layer 4, the silicon surface of the $p^+$-regions 34 and 35 respectively is exposed. Via said apertures the aluminium layer strips 30 and 31 form contact with the $p^+$-regions 34 and 35.

In the plan view of FIG. 7 the various forms of line have precisely the same notation as in the plan view of FIG. 1. The strip 29, 33 has a resistance of approximately 20 ohms per square and is a critical undercrossing connection in the integrated circuit in respect of the fact that from a circuit point of view this interconnection has to be achieved with as small a series resistance as possible. By comparison other undercrossing connections of a more conventional form are shown in the plan view of FIG. 7, it being noted that from a circuit point of view the series resistance of these interconnections are not so critical. Thus between aluminium strips 39 and 40 on the surface of the silicon oxide layer 4 there is a conductive connection layer 41 which is crossed-over by and insulated from further aluminium strips 42, 31 and 43. The layer 41 consists of a diffused surface $p^+$-region formed during the boron diffusion step and the resistance is approximately 50 ohms per square. The $p^+$-layer 41 is contacted at opposite ends by the layers 39 and 40 via apertures 45 and 46 respectively in the silicon oxide layer 4.

Further crossing interconnections are present between the aluminium strip 30 and further circuit elements which are not shown. These connections are provided by discrete portions of the boron doped polycrystalline silicon layer which lies mainly on the silicon oxide layer 3. Thus via apertures 47 and 48 in the silicon oxide layer 4 the aluminium strip 30 makes contact with underlying strip portions 49 and 50 respectively of the boron doped polycrystalline silicon layer. The portions 49 and 50 lie on the silicon oxide layer 3 and extend to other circuit elements. They are crossed by the aluminium strips on the surface of the oxide layer 4 and this layer forms the mutual insulation at the crossings. Thus the polycrystalline silicon strip 49 is crossed in an insulating manner by the aluminium layer strip 51 and the polycrystalline silicon strip 50 is crossed in an insulating manner by the aluminium strips 25, 26, 27, 28, 43 and 40. The resistance of the polycrystalline silicon connection strips 49 and 50 is approximately 150 ohms per square.

The processing sequence of the integrated circuit shown in FIGS. 7 and 8 corresponds with that previously described with reference to FIGS. 1 to 5.

Referring now to FIG. 9 there is shown in plan view another part of an integrated circuit comprising insulated gate field effect transistors and processed in the same manner as previously described. In this Figure some of the insulated gate field effect transistors present are shown together with an undercrossing device in accordance with the invention. The notation for the various forms of lines is the same as in the previous embodiments with the exception that the contact apertures in the silicon oxide layers are shown in full lines.

The integrated circuit comprises an n-type silicon body of the same resistivity and thickness as described with reference to the preceding embodiments and corresponding thermally grown and deposited insulating layers 3 and 4 are present. Conductive connection layers 61 to 71 inclusive, referred to as first conductive connection layers, in the form of aluminium layer strips extend on the surface of the deposited silicon oxide layer 4. These cross-over and are insulated from a conductive connection layer 72, referred to as a second conductive connection layer. The second conductive connection layer 72 is in the form of a strip and provides part of the conductive connection between two further conductive connection layers consisting of aluminium layer strips 73 and 74 situated on the deposited silicon oxide layer 4 at opposite sides of the aluminium layer strips 61 to 71 inclusive.

The second conductive connection layer 72 consists of a layer of polycrystalline silicon locally deposited on the silicon body surface in an aperture in the thermally grown silicon oxide layer 3. Said polycrystalline layer is doped with boron as is the portion of the silicon body underlying the polycrystalline layer also belonging to the undercrossing and doped with boron atoms diffused therein via the polycrystalline layer.

The surface portion of the silicon body around the whole perimeter of the strip 72 is also doped with boron, due to the direct diffusion of boron into portions of the silicon surface exposed by removal of the silicon oxide layer 3. At the opposite ends ot the strip 72 there are $p^+$-diffused regions 75 and 76. Said regions correspond in depth and boron concentration to the source and drain regions of the transistors in the integrated circuit and these regions form part of a common p-type region which also constitutes an electrode region of several transistors. The transistors are referenced $T_1$ to $T_{13}$ inclusive, the references being shown applied on the polycrystalline silicon gate electrodes. At apertures which extend through the deposited silicon oxide layer 4 the surface of the $p^+$-regions 75 and 76 is exposed. Via said apertures the aluminium layer strips 73 and 74 form contact with the $p^+$-regions 75 and 76.

In the part of the integrated circuit shown in plan view in FIG. 9, the circuit design is such that the interconnection of the aluminium strips 73 and 74 has to be achieved with a minimum series resistance and for this reason the conductive connection layer 72 is provided in the form of the boron doped polycrystalline silicon strip in direct contact with the silicon body surface, said part of the body surface also being doped with boron atoms.

FIG. 10 is an enlarged plan view of the lower portion of the part of the circuit shown in FIG. 9; FIG. 11 is a cross-sectional view taken along the line XI—XI in FIG. 10.

In FIG. 10 the boron doped polycrystalline silicon gate electrodes are shown for transistors $T_5$, $T_7$, $T_8$ and $T_9$. These gate electrodes are formed at the ends of portions of the polycrystalline silicon layer and are seperated from the surface of the body by portions of the thinner silicon oxide layer formed in the apertures in the thicker silicon oxide layer 3 prior to the deposition of the polycrystalline silicon layer. Thus in the cross-section of FIG. 11 the gate electrode of transistor $T_7$ is formed by way of example, by the end of a portion 77 of the polycrystalline silicon layer and lies on a part 78 of the thin oxide layer. The other end of the portion 77 of the polycrystalline silicon layer makes a direct contact with the $p^+$-diffused common drain region of transistors $T_8$ and $T_9$ and this contact lies within an area bounded by the dotted line where the thin oxide has been removed prior to the polycrystalline silicon deposition.

The $p^+$ region 76 forms part of a larger $p^+$-region which also comprises inter alia a part 80 forming the $p^+$-drain region of transistor $T_7$. The source region of transistor $T_7$ is formed by a further diffused $p^+$-region 81 which is contacted by an aluminium strip 82 via an aperture in the deposited silicon oxide layer 4. Similarly the $p^+$-source region 83 of transistor $T_8$ is contacted by the aluminium strip 74 via an aperture in the deposited oxide layer 4.

In the cross-section of FIG. 11 there is also shown a polycrystalline silicon portion 85 which further extends in one direction in the plan view of FIG. 10 as the gate electrode of transistor $T_5$ where it is situated on the thin oxide, and in the other direction is contacted by the aluminium strip 71 via an aperture in the deposited oxide layer 4.

A further polycrystalline silicon layer 87 forms contact with a $p^+$-diffused surface region 88, again within an area bounded by the dotted line where the thin oxide has been locally removed prior to the polycrystalline silicon deposited. From the region 88 there extends the further p-type diffused region 89 which forms the source zone of transistor $T_5$, the drain of said transistor being formed by a $p^+$-type diffused region 90 adjoining the perimeter of the strip 72.

It will be appreciated that many modifications may be made within the scope of the invention. For example other semiconductor materials and dopants may be employed. Instead of p-type channel integraded circuits which are the subject of the described embodiments, n-type channel integrated circuits may be formed. Also the invention may be employed, for example, in integrated circuits with comptementary transistors and in bipolar integrated circuits. Furthermore the modification of the embodiment of FIGS. 1 and 2 and described with reference to FIG. 6 may be employed in any of the remaining embodiments.

What is claimed is:

1. A semiconductor device, in particular an integrated circuit, comprising:
   a. a semiconductor body comprising an insulating layer present on a surface thereof,
   b. at least a first electric connection comprising a first conductive layer extending over said insulating layer, and
   c. a second electric connection present at least partly below said first connection, said second connection crossing said first connection and being electrically insulated therefrom, said second electric connection comprising a second conductive layer that comprises a first component layer in the form of semiconductor material which is locally deposited on said body surface and is doped with an impurity and a second component layer formed by a surface region of said body underlying said first component layer, said second component layer beind doped with said impurity introduced into said body via the first component layer.

2. A semiconductor device as in claim 1, wherein said first component layer comprises deposited polycrystalline semiconductorr material.

3. A semiconductor device as in claim 1, wherein said impurity is introduced in said second conductive layer by vapor phase diffusion.

4. A semiconductor device as in claim 1, further comprising a second insulating layer located between said first and second electric connections.

5. A semiconductor device as in claim 1, wherein said second conductive layer is in the form of a strip which is crossed by said first conductive connection layer, said device comprising two further conductive connection layers which extend at least partly on said insulating layer and said second conductive layer forming at least part of the conductive connection between said further conductive connection layers.

6. A semiconductor device as in claim 5, wherein at least at one end of said second conductive layer said further conductive connection layer associated with said one end part is applied directly on a portion of said first component layer located directly on the semiconductor body surface.

7. A semiconductor device as in claim 1, comprising a semiconductor integrated circuit wherein said first and second conductive connections form interconnection layers at different levels.

8. A semiconductor device as in claim 7, wherein said semiconductor body is of silicon and the first component layer of said second conductive connection layer is of doped polycrystalline silicon.

9. A semiconductor device as in claim 8, wherein said first conductive layer consists essentially of aluminum.

10. A semiconductor device as in claim 8, wherein said integrated circuit comprises a plurality of insulated gate field effect transistors, said first component layer comprising one of a plurality of discrete portions of a deposited layer of polycrystalline silicon, at least other discrete portions of the polycrystalline silicon layer being situated at least partly on said insulating layer and forming a gate electrode of a said field effect transistor.

11. A semiconductor device as in claim 10, wherein said other discrete portions of said polycrystalline silicon layer extend on a relatively thin part of said insulating layer to form said gate electrode and further extend on a relatively thick part of said insulating layer to form an interconnection layer.

12. A semiconductor device as in claim 11, wherein, at a position remote from the gate electrode, said other discrete portions of the polycrystalline silicon layer extend above and are in contact with a surface portion of said semiconductor body.

* * * * *

UNITED STATES PATENT AND TRADEMARK OFFICE
CERTIFICATE OF CORRECTION

PATENT NO. : 3,964,092
DATED : June 15, 1976
INVENTOR(S) : ERIC WADHAM

It is certified that error appears in the above-identified patent and that said Letters Patent are hereby corrected as shown below:

Column 2, line 49, after "is" insert --in contrast--

Column 3, line 21, change "wwith" to --with--

Column 9, line 25, change "ot" to --of-- line 55, change "seperated" to --separated--

Column 10, line 30, change "intergraded" to --intergrated--

Column 10, line 62, change "semiconductorr" to

--semiconductor--

Signed and Sealed this

Nineteenth Day of October 1976

[SEAL]

Attest:

RUTH C. MASON
Attesting Officer

C. MARSHALL DANN
Commissioner of Patents and Trademarks